United States Patent
Ota

(10) Patent No.: US 10,483,330 B2
(45) Date of Patent: Nov. 19, 2019

(54) ELECTRO-OPTICAL DEVICE AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/013,087

(22) Filed: Jun. 20, 2018

(65) Prior Publication Data

US 2019/0006429 A1    Jan. 3, 2019

(30) Foreign Application Priority Data

Jun. 30, 2017 (JP) ................................. 2017-128236

(51) Int. Cl.
*H01L 27/32* (2006.01)

(52) U.S. Cl.
CPC ........ *H01L 27/322* (2013.01); *H01L 27/3272* (2013.01)

(58) Field of Classification Search
CPC ......... G09G 2300/0452; G09G 3/3607; G09G 3/2003; H01L 27/3213; H01L 27/322; H01L 27/3218; H01L 27/3211
USPC ....................... 257/13, 48, 79–103, 744–745, 257/E33.001–E33.043, E33.055–E33.077, 257/431–466, E31.001–E31.131
See application file for complete search history.

(56) References Cited

U.S. PATENT DOCUMENTS

| | | | |
|---|---|---|---|
| 6,366,025 B1* | 4/2002 | Yamada | H01L 27/3246 313/498 |
| 6,445,005 B1 | 9/2002 | Yamazaki et al. | |
| 7,612,811 B2* | 11/2009 | Takeuchi | H01L 27/14621 348/272 |
| 2006/0221092 A1 | 10/2006 | Noguchi et al. | |
| 2013/0082589 A1* | 4/2013 | So | H01L 51/5036 313/504 |
| 2013/0093737 A1 | 4/2013 | Ota et al. | |
| 2015/0123083 A1* | 5/2015 | Xi | H01L 27/322 257/40 |
| 2016/0126295 A1 | 5/2016 | Sato | |
| 2016/0276421 A1* | 9/2016 | Lee | H01L 27/3272 |
| 2018/0212000 A1 | 7/2018 | Sato | |

FOREIGN PATENT DOCUMENTS

| | | |
|---|---|---|
| JP | 2006-309118 A | 11/2006 |
| JP | 2008-300367 A | 12/2008 |
| JP | 2013-020981 A | 1/2013 |
| JP | 2013-073884 A | 4/2013 |
| JP | 2013-088611 A | 5/2013 |
| JP | 2015-201326 A | 11/2015 |
| JP | 2016-090812 A | 5/2016 |

\* cited by examiner

*Primary Examiner* — Jonathan Han
(74) *Attorney, Agent, or Firm* — Oliff PLC

(57) ABSTRACT

There is provided an electro-optical device including a first pixel, a second pixel, a third pixel, a first light shielding portion provided between the first pixel and the second pixel, a second light shielding portion provided between the second pixel and the third pixel, in which a width of the first light shielding portion and a width of the second light shielding portion are different.

16 Claims, 11 Drawing Sheets

| | L1R | L2R | L1G | L2G | L1B | L2B |
|---|---|---|---|---|---|---|
| | 3.4 | 1.8 | 3.4 | 3.6 | 2.7 | 2.9 |
| ΔL=L2−L1 | -1.6 | | 0.2 | | 0.2 | |
| L2/L1 | 0.53 | | 1.06 | | 1.07 | |

| | L1R | L2R | L1G | L2G | L1B | L2B |
|---|---|---|---|---|---|---|
| | 2.2 | 1.2 | 2.2 | 2.4 | 1.5 | 1.7 |
| ΔL=L2−L1 | -1 | | 0.2 | | 0.2 | |
| L2/L1 | 0.55 | | 1.09 | | 1.13 | |

FIG. 10

|  | L1R | L2R | L1G | L2G | L1B | L2B |
|---|---|---|---|---|---|---|
|  | 1.35 | 1.05 | 1.35 | 1.9 | 2.6 | 2.75 |
| ΔL=L2−L1 | −0.3 || 0.55 || 0.15 ||
| L2/L1 | 0.78 || 1.41 || 1.06 ||

ELECTRO-OPTICAL DEVICE AND ELECTRONIC APPARATUS

BACKGROUND

1. Technical Field

The present invention relates to an electro-optical device and an electronic apparatus.

2. Related Art

In recent years, various types of electro-optical devices for displaying an image with pixels each pixel having a light emitting element such as a silicon organic light emitting diode (OLED) element and a driving transistor for supplying a current to the light emitting element are proposed. In such an electro-optical device, generally, one display unit is formed with a pixel block configured with a plurality of pixels. For example, it is possible to display a full color image by forming one display unit with a pixel block including a pixel for displaying red (hereinafter, written as R), a pixel for displaying green (hereinafter, written as G), and a pixel for displaying blue (hereinafter, written as B).

In the electro-optical device capable of displaying a full color image, in order to realize desired white brightness and color coordinates, it is necessary to adjust current values of currents supplied to the light emitting elements in each pixel R, G, and B in consideration of a resonance structure, EL element characteristics, and color filter characteristics. As a result, when desired white display is performed, the current values of the currents supplied to the light emitting elements of each of the pixels R, G, and B are different. There has been a problem that the lifetime of the pixels varies due to the difference in the current values. It is because the larger the current flows in the light emitting element, the more easily the pixel deteriorates. In JP-A-2008-300367, a technique of adjusting an area of a light emitting region emitting light in the light emitting element provided in each pixel of R, G, and B to equalize the lifetime of the pixels is disclosed. More specifically, in JP-A-2008-300367, the technique of maximizing the area of the light emitting region of B in a case where the current value of the current supplied to the light emitting element in the B pixel is the largest at the time of white display is disclosed. By doing so, since the brightness of B at the time of viewing the display image of the electro-optical device from a distance can be increased, it is possible to perform the desired white display while suppressing the current supplied to the light emitting element in the B pixel, and equalize the lifetime of pixels.

The occurrence of variations in the lifetime of the pixels resulting from the difference in the current values of the currents supplied to the light emitting elements in each pixel R, G, and B at the time of white display is not the only problem in the electro-optical device capable of displaying a full color image. For example, in a microdisplay, gradation can be controlled with a minute current of 100 nA or less, but the smaller the magnitude of the supplied current is, the larger the variation in the characteristics occurs in the driving transistor for controlling the current supplied to the light emitting element. For this reason, there has been a problem that brightness unevenness is easily visible in the pixel (for example, pixel R) having the lowest current value of the current to be supplied to the light emitting element. Such brightness unevenness cannot be improved with the technique disclosed in JP-A-2008-300367. The reasons are as follows.

Assuming that an area of a display surface as S, an area of a light emitting region of R as SR, and light emitting brightness of the same light emitting region as LR1 in the electro-optical device, the brightness LR of R at the time of viewing the same display surface from a distance is expressed by the following Equation (1).

$$LR = LR1 \times SR/S \quad (1)$$

The larger a current density JR in the same light emitting region is, the higher a light emitting brightness LR1 at the time of viewing the light emitting region of R gets. The relationship between a current IR flow in the light emitting element and the current density JR in a pixel belonging to the light emitting region of R satisfies the following Equation (2).

$$IR = JR \times SR \quad (2)$$

The larger the current density JR is, the higher the light emitting brightness LR1 gets. To increase the light emitting brightness LR1 (in other words, current density JR) while keeping the brightness LR of R constant at the time of viewing the display surface of the electro-optical device from a distance, it is preferable to decrease the area SR of the light emitting region of R. However, because of the relationship of Equation (2), the increment of the current density JR is canceled by the decrease of the area SR, and the current IR does not change. This is the reason why the brightness unevenness cannot be improved with the technique described in JP-A-2008-300367.

SUMMARY

An advantage of some aspects of the invention is to provide a technique for improving the brightness unevenness resulting from a large difference in currents supplied to the light emitting elements at the time of the white display in each pixel of R, G, and B.

In order to solve the problems, the electro-optical device according to the invention includes: a first pixel, a second pixel, a third pixel, a first light shielding portion provided between the first pixel and the second pixel, and a second light shielding portion provided between the second pixel and the third pixel. A width of the first light shielding portion and a width of the second light shielding portion are different.

According to the invention, it is possible to adjust brightness of light emitted from a light emitting region to which each first pixel, second pixel and third pixel belongs when viewing the electro-optical device from a distance with a ratio (hereinafter, referred to as pixel opening ratio) of the width of the light emitting region that is not covered with the first or the second light shielding portion with respect to the width of the light emitting region (that is, width of pixel opening portion). Accordingly, it is possible to improve the brightness unevenness resulting from a large difference in currents supplied to the light emitting elements at the time of the white display in each pixel of R, G, and B.

To explain in more detail, it is preferable that each first pixel, second pixel, and third pixel of the above-described electro-optical device include a light emitting element, a current value of a current supplied to the light emitting element of the first pixel be the lowest among the current values of the currents supplied to each of light emitting elements at the time of the white display, and the width of the first light shielding portion be larger than the width of second light shielding portion.

In this case, the first pixel is R pixel. Assuming that an area of a display unit as S, an area of a light emitting region of R as SR, light emitting brightness of the same light emitting region as LR1, and a pixel opening ratio as T in the electro-optical device, the brightness LR at the time of viewing the light emitting region from a distance is expressed by the following Equation (3).

$$LR = LR1 \times T \times SR/S \quad (3)$$

Accordingly, by decreasing T, it is possible to increase the light emitting brightness LR1 (In other words, current density JR) while keeping the brightness LR constant without decreasing the area SR of the light emitting region of pixel R, that is, increasing the current value of the current flowing in the light emitting element of pixel R, and improving the brightness unevenness.

The above-described electro-optical device may further include a first color filter covering a light emitting region of the first pixel, a second color filter covering a light emitting region of the second pixel, and a third color filter covering a light emitting region of the third pixel. The first color filter may transmit light having a longer wavelength compared to the second color filter and the third color filter, the second color filter may have a projection portion projecting toward the light emitting region of the first pixel, and the first light shielding portion may be the projection portion.

In the above-described electro-optical device, the second color filter may transmit light having a shorter wavelength compared to the third color filter. In a case where a full color image is displayed using each pixel of R, G, and B, the second color filter is a color filter that transmits blue light. In this case, compared with a case where the second color filter is a color filter that transmits green light, an effect of increasing the light shielding efficiency of R light with the projection portion is exerted.

In the above-described electro-optical device, the first pixel may be interposed between the second pixels.

In the above-described electro-optical device, at least one of the first light shielding portion and the second light shielding portion may be a black matrix. In this case, compared with a case of realizing the second light shielding portion by projection of the color filter toward the light emitting region, a higher light shielding efficiency is exerted.

In addition to the electro-optical device, the invention can be conceptualized as an electronic apparatus including the electro-optical device. A typical example of the electronic apparatus includes a display device such as a head mounted display (HMD) or an electronic viewfinder.

BRIEF DESCRIPTION OF THE DRAWINGS

The invention will be described with reference to the accompanying drawings, wherein like numbers reference like elements.

FIG. 10 is a table showing a size example of components of the display unit of the electro-optical device according to the second embodiment of the invention.

DESCRIPTION OF EXEMPLARY EMBODIMENTS

Hereinafter, embodiments for carrying out the invention will be described with reference to the drawings. However, in each figure, the dimensions and the scale of each part are appropriately different from the actual one. In addition, since the embodiments described below are preferable specific examples of the invention, various technical limitations are given, but the scope of the invention is not limited to the embodiments unless there is a description to specifically limit the invention.

A. Embodiment

Hereinafter, an electro-optical device 1 according to the embodiment will be described.

1. Outline of Electro-optical Device

Figure 1:
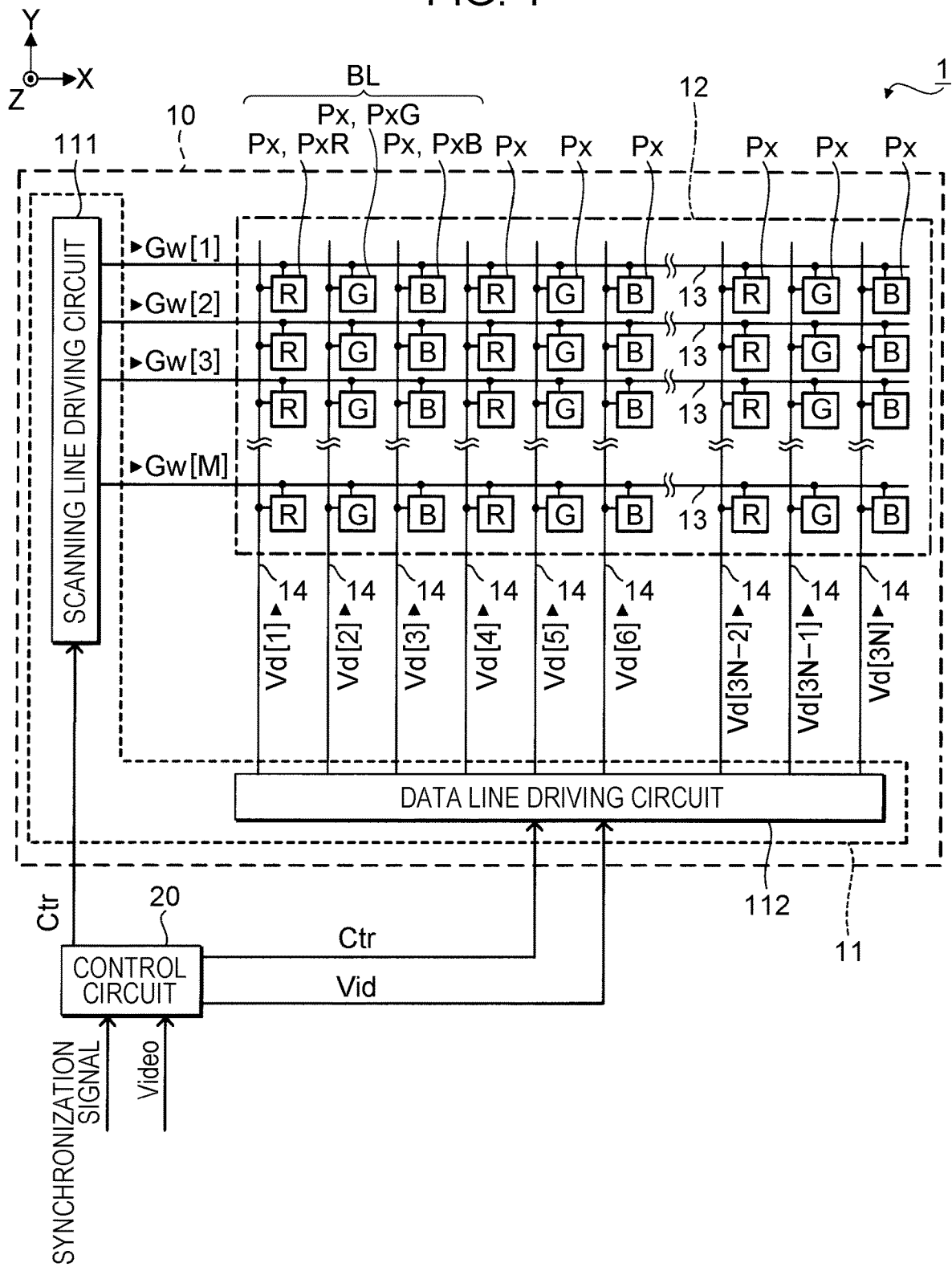
FIG. 1 is a block diagram illustrating a configuration example of an electro-optical device according to a first embodiment of the invention.

FIG. 1 is a block diagram illustrating a configuration example of an electro-optical device 1 according to a first embodiment of the invention.

As shown in FIG. 1, the electro-optical device 1 includes a display panel 10 which includes a plurality of pixels Px and a control circuit 20 which controls operation of the display panel 10.

Digital image data Video is supplied in synchronization with a synchronization signal from a host device (not illustrated) to the control circuit 20. Here, the image data Video is digital data that defines a gradation level to be displayed by each pixel Px of the display panel 10. The synchronization signal is a signal including a vertical synchronization signal, a horizontal synchronization signal, a dot clock signal and the like.

Based on the synchronization signal, the control circuit 20 generates a control signal Ctr to control the operation of the display panel 10 and supplies the generated control signal Ctr to the display panel 10. In addition, based on the image data Video, the control circuit 20 generates an analog image signal Vid, and supplies the generated image signal Vid to the display panel 10. Here, the image signal Vid is a signal that defines brightness of a light emitting element included in a pixel Px so that each of the pixel Px displays the gradation specified by the image data Video.

As illustrated in FIG. 1, the display panel 10 includes M number of scanning lines 13 extending in +X direction, 3N number of data lines 14 extending in +Y direction, a display unit 12 having "M×3N" number of pixels Px arranged corresponding to an intersection of the M number of the scanning lines 13 and the 3N number of the data lines 14, and a driving circuit 11 driving the display unit 12 (M is a natural number equal to or greater than 1, N is a natural number equal to or greater than 1).

Hereinafter, to distinguish the plurality number of pixels Px, a plurality of the scanning lines 13, and a plurality of the data lines 14 from each other, the rows are referred to as a first row, a second row, . . . , and an M-th row in order from +Y direction to −Y direction (hereinafter, +Y direction and Y direction are collectively called as "Y axial direction"), and the columns are referred to as a first column, a second column, . . . , and a 3N-th column in order from −X direction to the +X direction (hereinafter, +X direction and X direction are collectively called as "X axial direction"). Hereinafter, +Z direction (upward direction) and Z direction (downward direction) intersecting with the X axial direction and the Y axial direction are collectively called as "Z axial direction".

The plurality of pixels Px provided in the display unit 12 include a pixel PxR capable of displaying red (R), a pixel PxG capable of displaying green (G), and a pixel PxB capable of displaying blue (B). In the embodiment, when n is a "natural number satisfying 1≤n≤N", a case where the pixel PxR is arranged in the (3n−2)-th column, the pixel PxG is arranged in the (3n−1)-th column, and the pixel PxB is arranged in the 3n-th column in the first to the 3N-th columns is assumed as an example.

Moreover, when m is a "natural number satisfying 1 ≤m≤M", and k is a "natural number satisfying 1 ≤k≤3N", the pixel Px of the m-th row and the k-th column may be expressed as pixel Px[m][k]. That is, in the embodiment, for example, the pixel PxR can be expressed as pixel PxR[m][3n−2], the pixel PxG as pixel PxG[m][3n−1], and the pixel PxB as pixel PxB[m][3n].

In the embodiment, the three adjacent pixels PxR, PxG, and PxB in the X axial direction may be referred to as a pixel block BL. That is, in the embodiment, a case where the pixel block BL of M-th row×N-th column is arranged in matrix in the display unit 12 is assumed. Hereinafter, the pixel block BL including the pixel PxR[m][3n−2], the pixel PxG[m] [3n−1], and the pixel PxB[m][3n] may be referred to as a pixel block BL[m][n].

As illustrated in FIG. 1, the driving circuit 11 includes a scanning line driving circuit 111 and a data line driving circuit 112.

The scanning line driving circuit 111 scans (selects) from the first to the M-th row scanning lines 13 in order. Specifically, in one frame period, the scanning line driving circuit 111 selects the scanning line 13 in a row unit for each horizontal scanning period in order by setting scanning signals Gw[1] to Gw[M] to be output to each of the first to the M-th row scanning lines 13 at a predetermined selective potential in order of each horizontal scanning period. In other words, during an m-th horizontal scanning period in one frame period, the scanning line driving circuit 111 selects the m-th row scanning line 13 by setting the scanning signal Gw[m] to be output to the m-th row scanning line 13 at the predetermined selective potential. One frame period is a period that the electro-optical device 1 displays one image.

The data line driving circuit 112, based on the image signal Vid and the control signal Ctr supplied from the control circuit 20, generates analog data signals Vd[1] to Vd[3N] which defines a gradation to be displayed by each pixel Px, and outputs the generated data signals Vd[1] to Vd[3N] to the 3N number of data lines 14 for each horizontal scanning period. In other words, the data line driving circuit 112 outputs a data signal Vd[k] to the k-th column data line 14 in each horizontal scanning period.

In the embodiment, the image signal Vid output by the control circuit 20 is an analog signal, but the image signal Vid output by the control circuit 20 may be a digital signal. In this case, the data line driving circuit 112 performs D/A conversion on the image signal Vid, and generates analog data signals Vd[1] to Vd[3N].

Figure 2:
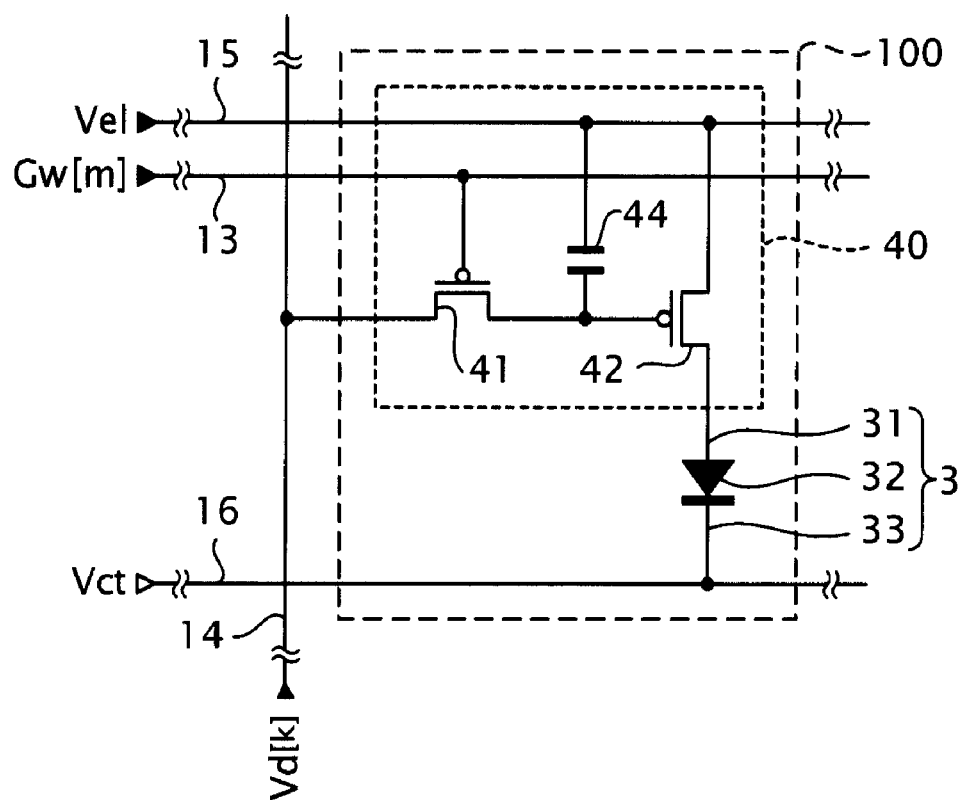
FIG. 2 is an equivalent circuit diagram illustrating a configuration example of a pixel.

FIG. 2 is an equivalent circuit diagram illustrating a configuration example of a pixel circuit 100 provided in each pixel Px. In the embodiment, a plurality of the pixel circuits 100 corresponding to the plurality of pixels Px have an electrically same configuration. In FIG. 2, an example of the pixel circuit 100 provided in the m-th row and the k-th column pixel Px[m][k] will be explained.

The pixel circuit 100 includes the light emitting element 3 and a supply circuit 40 which supplies a current to the light emitting element 3.

The light emitting element 3 includes a pixel electrode 31, a light emitting functional layer 32 and a common electrode 33. The pixel electrode 31 functions as an anode that supplies a positive hole to the light emitting functional layer 32. The common electrode 33 is electrically connected to a power supply line 16 set at a potential Vct which is a low potential side power supply potential of the pixel circuit 100, and functions as a cathode for supplying an electron to the light emitting functional layer 32. The positive hole supplied from the pixel electrode 31 and the electron supplied from the common electrode 33 are coupled by the light emitting functional layer 32, and the light emitting functional layer 32 emits white light.

Although details will be described later, a red color filter 81R is superimposed on the light emitting element 3 (hereinafter referred to as light emitting element 3R) included in the pixel PxR. A blue color filter 81B is superimposed on the light emitting element 3 (hereinafter referred to as light emitting element 3B) included in the pixel PxB. A green color filter 81G is superimposed on the light emitting element 3 (hereinafter referred to as light emitting element 3G) included in the pixel PxG. Accordingly, it is possible to display a full color image by the pixels PxR, PxG, and PxB.

The supply circuit 40 includes P channel type transistors 41 and 42 and a holding capacitor 44. One or both of the transistors 41 and 42 may be an N channel type transistor. In the embodiment, a case of the transistors 41 and 42 being a thin film transistor is exemplified, but the transistors 41 and 42 may be a field effect transistor such as a metal-oxide-semiconductor field-effect transistor (MOSFET).

The gate of the transistor 41 is electrically connected to the m-th row scanning line 13, one of a source or a drain of the transistor 41 is electrically connected to the k-th column data line 14, the other one of the source or the drain of the transistor 41 is electrically connected to the gate of transistor 42 and one of two electrodes of the holding capacitor 44.

The gate of transistor 42 is electrically connected to the other one of the source or the drain of the transistor 41 and one electrode of the holding capacitor 44, one of a source or a drain of the transistor 42 is electrically connected to the pixel electrode 31, and the other one of the source or the drain of the transistor 42 is electrically connected to a power supply line 15 set at a potential Vel which is a power supply potential on the high potential side of the pixel circuit 100.

One of the two electrodes of the holding capacitor 44 is electrically connected to the source or the drain of the transistor 41 and the gate of the transistor 42, and the other electrode of the two electrodes of the holding capacitor 44 is electrically connected to the power supply line 15 in the holding capacitor 44. The holding capacitor 44 functions as a holding capacitor for holding a gate potential of the transistor 42.

When the scanning line driving circuit 111 sets the scanning signal Gw[m] at a predetermined selective potential and selects the m-th row scanning line 13, the transistor 41 provided at the m-th row and k-th column pixel Px[m][k] is turned on. When the transistor 41 is turned on, the data signal Vd[k] is supplied from the k-th column data line 14 to the gate of the transistor 42. In this case, the transistor 42 supplies a current corresponding to a potential of the data signal Vd[k] (more precisely, potential difference between gate and source) supplied to the gate with respect to the light emitting element 3. In other words, the transistor 42 is a driving transistor which supplies a current to the light emitting element 3. The light emitting element 3 emits light corresponding to brightness based on the magnitude of the current supplied from the transistor 42, that is, the brightness based on the potential of the data signal Vd[k].

Thereafter, in a case where the scanning line driving circuit 111 deselects the m-th row scanning line 13 and the transistor 41 is turned off, the gate potential of the transistor 42 is held by the holding capacitor 44. For this reason, the light emitting element 3 can emit light at the brightness corresponding to the data signal Vd[k] even after the transistor 41 is turned off.

2. Configuration of Display Unit 12

A configuration example of the display unit 12 according to the embodiment will be explained with reference to FIGS. 3 and 4.

Figure 3:
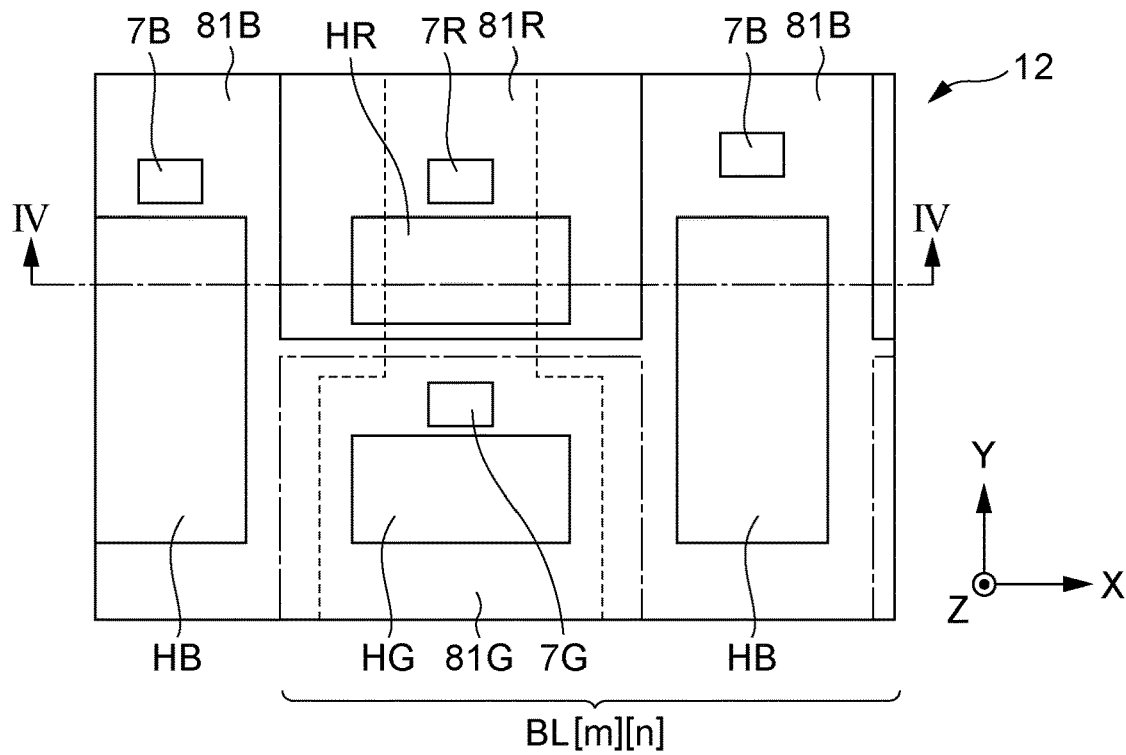
FIG. 3 is a plan view illustrating a configuration example of a display unit.

FIG. 3 is a plan view illustrating an example of a schematic configuration of the display unit 12 of a case where a portion of the display unit 12 according to the embodiment is viewed from top in the +Z direction which is the direction that the electro-optical device 1 is emitting light. More specifically, the pixel block BL[m][n] in the display unit 12 is illustrated in FIG. 3. As described above, the pixel block BL[m][n] includes the pixel PxR[m][3n−2], the pixel PxG[m][3n−1], and the pixel PxB[m][3n].

The pixel PxR[m][3n−2] has the light emitting element 3R, the pixel PxG[m][3n−1] has the light emitting element 3G, and the pixel PxB[m][3n] has the light emitting element 3B respectively. The light emitting element 3R has a light emitting region HR, the light emitting element 3G has a light emitting region HG, and the light emitting element 3B has a light emitting region HB respectively. The light emitting regions HR, HG, and HB respectively emit light toward the +Z direction. In the embodiment, as illustrated in FIG. 3, a case where the pixel PxR is positioned in the +Y direction of the pixel PxG, and the pixel PxB is positioned in the +X direction of the pixel PxR and the pixel PxG in each pixel block BL is assumed. In this case, as illustrated in FIG. 3, the pixel PxR belonging to the pixel block BL[m][n] is interposed between the pixel PxB belonging to the pixel block BL[m][n] and the pixel PxB belonging to the pixel block BL[m][n−1]. Hereinafter, a case where the light emitting region HB is larger than the light emitting region HR and the light emitting region HB is larger than the light emitting region HG when viewed from top is assumed. In FIG. 3, a contact 7R is a component for electrically connecting the pixel electrode 31 and the supply circuit 40 in the pixel PxR, a contact 7G is a component for electrically connecting the pixel electrode 31 and the supply circuit 40 in the pixel PxG, and a contact 7B is a component for electrically connecting the pixel electrode 31 and the supply circuit 40 in the pixel PxB.

Figure 4:
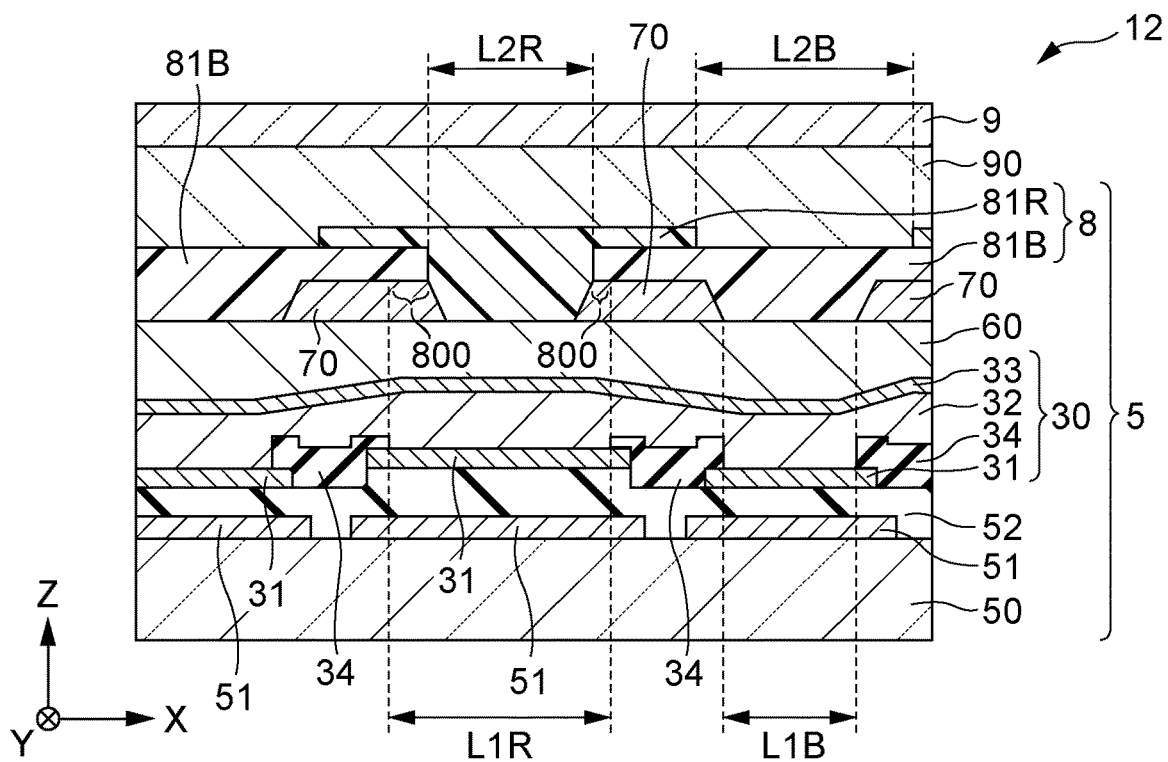
FIG. 4 is a partial sectional view illustrating a configuration example of the display unit.

FIG. 4 is an example of a partial sectional view of the display unit 12 taken along with line IV-IV in FIG. 3. As illustrated in FIG. 4, the display unit 12 includes an element substrate 5, a protection substrate 9, and an adhesive layer 90 (example of "packed layer") provided between the element substrate 5 and the protection substrate 9. In the embodiment, a case where the electro-optical device 1 is a top emission type electro-optical device which emits light from the protection substrate 9 side (+Z side) is assumed.

The adhesive layer 90 is a transparent resin layer for adhering the element substrate 5 and the protection substrate 9. The adhesive layer 90, for example, is formed with an epoxy resin such as an organic epoxy or a transparent resin material such as an acrylic resin.

The protection substrate 9 is a transparent substrate disposed on the +Z side of the adhesive layer 90. As the protection substrate 9, for example, a quartz substrate or a glass substrate or the like can be adopted.

The element substrate 5 includes a substrate 50, a reflective layer 51, a distance adjusting layer 52, a light emitting layer 30, a sealing layer 60, a bank 70, and a color filter layer 8 laminated on the substrate 50. Details will be described later, but the light emitting layer 30 includes above described light emitting element 3 (3R, 3G, 3B). The light emitting element 3 emits light to the +Z direction and the Z direction. The color filter layer 8 includes the above-described color filter 81R, the color filter 81G, and the color filter 81B.

The substrate 50 is a substrate mounted with various wirings such as the scanning line 13 or the data line 14, and various circuits such as the driving circuit 11 or the pixel circuit 100. The substrate 50 may be a substrate capable of mounting various wirings and various circuits. As the substrate 50, for example, a silicon substrate, a quartz substrate, or a glass substrate may be adopted. On the +Z side of the substrate 50, the reflective layer 51 is laminated.

The reflective layer 51 is a component for reflecting the light emitted from the light emitting element 3 of the light emitting layer 30 to the +Z direction side. The reflective layer 51 is formed with a material with high reflectivity, for example, aluminum, silver or the like. On the +Z side of the reflective layer 51, the distance adjusting layer 52 is laminated.

The distance adjusting layer 52 is an insulating transparent layer for adjusting an optical distance between the light emitting element 3 of the light emitting layer 30 and the reflective layer 51. The thickness of the distance adjusting layer 52 varies for each pixel PxR, pixel PxG, and pixel PxB. It is because it is preferable to set the thickness of the distance adjusting layer 52 according to the resonance wavelength of each light of the pixel PxR, the pixel PxG, and the pixel PxB. In other words, in the embodiment, an optical resonator is configured for each pixel PxR, pixel PxG, and pixel PxB. The distance adjusting layer 52 is formed with an insulating transparent material such as silicon oxide (SiOx). On the +Z side of the distance adjusting layer 52, the light emitting layer 30 is laminated. In the example illustrated in FIG. 4, the thickness of the distance adjusting layer 52 in the pixel PxR, the pixel PxG, and the pixel PxB is kept constant to simplify the explanation, but it is preferable to set the thickness of the distance adjusting layer 52 to a determined thickness according to resonance wavelength of light for each pixel PxR, pixel PxG, and pixel PxB.

The light emitting layer 30 has the pixel electrode 31 laminated on the distance adjusting layer 52, an insulating film 34 laminated on the distance adjusting layer 52 and the pixel electrode 31, the light emitting functional layer 32 laminated on the pixel electrode 31 and the insulating film 34 so as to cover the pixel electrode 31 and the insulating film 34, and the common electrode 33 laminated on the light emitting functional layer 32.

The pixel electrode 31 is a transparent layer having conductivity formed into an island-like shape for each pixel Px. The pixel electrode 31 is formed with a conductive transparent material such as indium tin oxide (ITO) or indium zinc oxide (IZO).

The insulating film 34 is disposed so as to cover the periphery portion of each pixel electrode 31, and is an insulating component which divides each of the light emitting region HR, the light emitting region HG and the light emitting region HB. The insulating film 34 is formed with an insulating material such as silicon oxide.

The common electrode 33 is a conductive component having light transmissivity and light reflectivity disposed to straddle on the plurality of pixels Px. The common electrode 33 is formed with an alloy such as Mg and Ag.

The light emitting functional layer 32 includes a positive hole injecting layer, a positive hole transport layer, an organic light emitting layer, and an electron transport layer, and is disposed to straddle on the plurality of pixels Px. As described above, the light emitting functional layer 32 receives supply of the positive hole from a portion not covered with the insulating film 34 in the pixel electrode 31, and emits white light. That is, when viewed from top, the portion of the pixel electrode 31 not covered with the insulating film 34 in the light emitting layer 30 corresponds to a light emitting region H emitting light. White light means a light including red light, green light, and blue light.

In the embodiment, the thickness of the distance adjusting layer 52 is adjusted by the reflective layer 51 and the common electrode 33 so that an optical resonance structure is formed. The light emitted from the light emitting functional layer 32 is repeatedly reflected between the reflective layer 51 and the common electrode 33, the strength of light with a wavelength corresponding to the optical distance between the reflective layer 51 and the common electrode 33 is strengthened, and the strengthened light is emitted to +Z side via the common electrode 33 to the protection substrate 9.

In FIG. 4, detailed illustration is omitted. The sealing layer 60 includes a lower sealing layer laminated on the common electrode 33, a flattening layer laminated on the lower sealing layer, and an upper sealing layer laminated on the flattening layer.

The lower sealing layer and the upper sealing layer are insulating transparent layers disposed so as to straddle on the plurality of pixels Px. The lower sealing layer and the upper sealing layer are components for suppressing intrusion of water, oxygen, or the like to the light emitting layer 30, and is formed, for example, with an inorganic material such as silicon oxide (SiOx), silicon nitride (SiNx), or aluminum oxide (AlxOy).

The flattening layer is a transparent layer disposed so as to straddle the plurality of pixels Px, and is a component for providing a flat upper surface (+Z side surface). The flattening layer, for example, is formed with a resin material such as an epoxy resin, an acrylic resin, an urethane resin, or a silicone resin, or an inorganic material such as silicon oxide.

As described above, the color filter layer 8 includes the bank 70 with light transmissivity, the color filter 81R which is the first color filter, the color filter 81B which is the second color filter, and the color filter 81B which is the third color filter. As illustrated in FIG. 4, on the +Z side of the color filter layer 8, the adhesive layer 90 is provided so as to cover the color filter layer 8, and on the +Z side of the adhesive layer 90, the protection substrate 9 is provided.

As illustrated in FIG. 4, the color filter 81G is formed on the sealing layer 60 (that is, the upper sealing layer) so as to cover the light emitting region HG when viewed from top on the +Z side of the light emitting region HG. The color filter 81B is formed on the sealing layer 60 and the color filter 81G so as to cover the light emitting region HB when viewed from top on the +Z side of the light emitting region HB. The color filter 81R is formed on the sealing layer 60, the color filter 81G, and the color filter 81R so as to cover the light emitting region HR when viewed from top on the +Z side of the light emitting region HR. The color filter 81R is made of a photosensitive resin material including a red color material, the color filter 81G is made of a photosensitive resin material including a green color material, and the color filter 81B is made of a photosensitive resin material including a blue color material.

Figures 5, 6, 7:
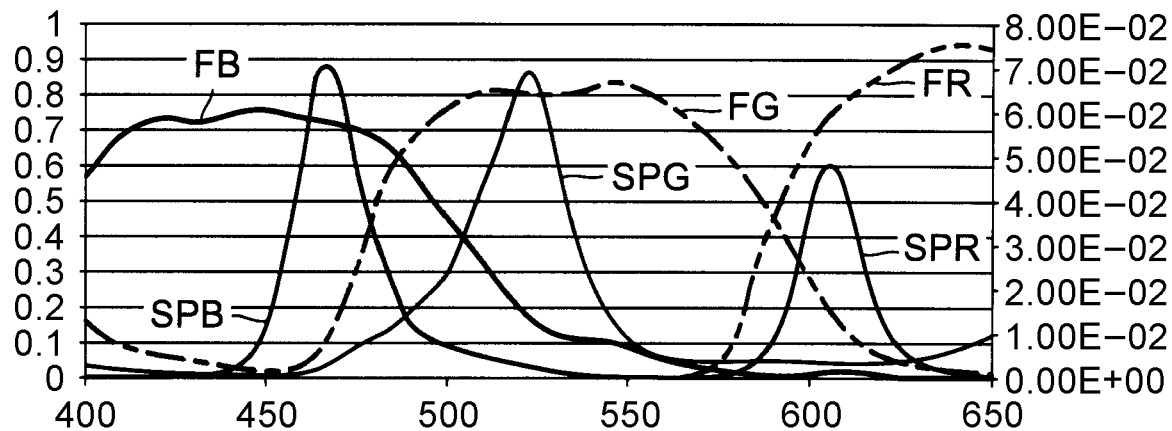
FIG. 5 is a graph showing a light emitting property of the pixel and a spectral property of a color filter.
FIG. 6 is a table showing a size example of components of the display unit.
FIG. 7 is a table showing another size example of components of the display unit.

FIG. 5 is a graph showing an example of respective spectrums SPR, SPG, and SPB of red light, green light and blue light included in the white light emitted from the light emitting region H and respective spectral properties FR, FG, and FB of the color filter 81R, the color filter 81G, and the color filter 81B. As shown in FIG. 5, the color filter 81R transmits red light, but does not transmit green light and blue light. The color filter 81G transmits green light, but transmits a part of each blue light and red light, and shades the rest. Moreover, the color filter 81B transmits blue light but transmits a part of green light. In addition, the color filter 81B does not transmit red light.

As illustrated in FIG. 4, the color filter 81B includes a projection portion 800 projecting toward the light emitting region HR. The projection portion 800 is provided on the bank 70. As described above, since the color filter 81B does not transmit red light, the projection portion 800 functions as a light shielding portion for shielding the red light included in the white light emitted from the light emitting region HR. In other words, in the display unit 12 of the embodiment, the width of the opening portion of the pixel PxR is narrowed by the width of the projection portion 800 in the X direction, and the opening ratio of the pixel PxR becomes small. Here, the opening ratio of the pixel PxR means the ratio of the width of the opening portion of the pixel PxR with respect to the width of the light emitting region HR of the pixel PxR. In the embodiment, the reason of providing the projection portion 800 in the color filter 81B as follows. Since the color filter 81B does not transmit red light, but the color filter 81G transmits a part of the red light, providing a projection portion in the color filter 81B has higher light shielding efficiency compare to the case where the projection portion 800 is provided in the color filter 81G.

3. Effect of Embodiment

In the embodiment, assuming that area of the display surface of the display unit 12 as S, the area of the light emitting region HR as SR, the light emitting brightness of the light emitting region HR as LR1, and the opening ratio of the pixel PxR as T, the brightness LR at the time of viewing the light emitting region HR from a distance is expressed by the following Equation (3).

$$LR = LR1 \times T \times SR/S \quad (3)$$

According to the embodiment, by decreasing T, it is possible to increase the light emitting brightness LR1 of light emitting region of R (in other words, current density JR) while keeping the brightness LR constant without decreasing the area SR of the light emitting region HR, that is, increasing the current value of the current flow in the light emitting element of pixel R. As a result, it is possible to improve the brightness unevenness resulting from the variation in the driving transistors (transistors 42) which control the current supplied to the light emitting element 3R.

For example, the current ratio of R, G, and B is assumed to be 1:1.8:2 in a case where there is no projection portion in a case where white display of 1,000 cd/m² and chromaticity (x, y)=(0.31, 0.31) is performed in the display unit 12 having a length of 7.5 μm from an end portion of the pixel PxB in the −X direction to an end portion of the pixel PxR in the +X direction in the pixel block BL. In other words, the current flow in the light emitting element of the pixel PxR when performing white display is assumed to be the lowest. In this case, set a width L1R of the light emitting region HR in the X direction and a width L2R of the opening portion of the pixel PxR in the X direction are set as shown in FIG. 6. The units of L1R and L2R are μm (same in L1G, L2G, L1B, and L2B described below). Similarly, each of a width L1G of the light emitting region HG in the X direction, a width L2G of the opening portion of the pixel PxG in the X direction, a width L1B of the light emitting region HB in the X direction, and a width L2B of the opening portion of the pixel PxB in the X direction is set as shown in FIG. 6. In this case, the opening ratio T of the pixel PxR (L2R/L1R) is 0.55, and it is possible to perform the above-described white display by increasing the current IR flow in the light emitting element 3R as twice the current value compared to the case where no projection portion is provided. According to the embodiment, the current ratio of R, G, and B when performing the white display may be 1:1.2:1.3, for example, and the current having the same magnitude with the driving transistor which controls the light emitting element 3G or the current supplied to the light emitting element 3G also flows in the driving transistor which controls the current supplied to the light emitting element 3R. Accordingly, the brightness unevenness of the pixel R resulting from the variation in the driving transistor which controls the current supplied to the light emitting element 3R is improved. In a case where white display of 1,000 cd/m² and chromaticity (x, y)=(0.31, 0.31) is performed in the display unit 12 having a length of 5.1 μm from an end portion of the pixel PxB in the −X direction to an end portion of the pixel PxR in the +X direction in the pixel block BL, the same effect can be achieved when each L1R, L2R, L1G, L2G, L1B, and L2B are set as shown in FIG. 7. The ratio (L2/L1) of L2 with respect to L1 in the pixel R is 0.53 in the example shown in FIG. 6 and 0.55 in the example shown in FIG. 7, but the value range may be 0.4 to 0.8.

In the embodiment, by providing a projection portion projecting toward the light emitting region HR in the color filter 81B, the color filter 81B functions as a light shielding portion which shields the red light included in the white light emitted from the light emitting region HR. However, by setting a projection portion projecting toward the light emitting region HG in the color filter 81B or the color filter 81R, the color filter 81B or the color filter 81R may function as a light shielding portion which shields the green light included in the white light emitted from the light emitting region HG. Similarly, by setting a projection portion projecting toward the light emitting region HB in the color filter 81R, the color filter 81R may function as a light shielding portion which shields the blue light included in the white light emitted from the light emitting region HB. Furthermore, by setting a projection portion projecting toward the light emitting region HB in the color filter 81G, the color filter 81G may function as a light shielding portion which shields the blue light included in the white light emitted from the light emitting region HB. However, with consideration of the light shielding efficiency, it is preferable that the color filter 81R have a function of a light shielding portion. As described above, by providing a plurality of types of light shielding portions and finely adjusting the projecting widths toward the light emitting region of each light shielding portion, it is possible to finely adjust the current supplied to the light emitting element 3 in each pixel R, G, and B at the time of white display. However, it is obvious that there is a need to increase the projection width with respect to the light emitting region of the pixel having the lowest current value of the current supplied to the light emitting element 3 of R, B, and B at the time of white display to the maximum.

B. Other Embodiments

Each of the above embodiments can be variously modified. Other specific embodiment will be exemplified below. Two or more embodiments randomly selected from the examples below may be appropriately merged within a range not mutually contradictory. Furthermore, detailed explanation of the same elements having the same actions and functions as the first embodiment in the second to sixth embodiments exemplified below will be omitted by applying the same numerical numbers referred in the description above.

B-1. Second Embodiment

Figure 8:
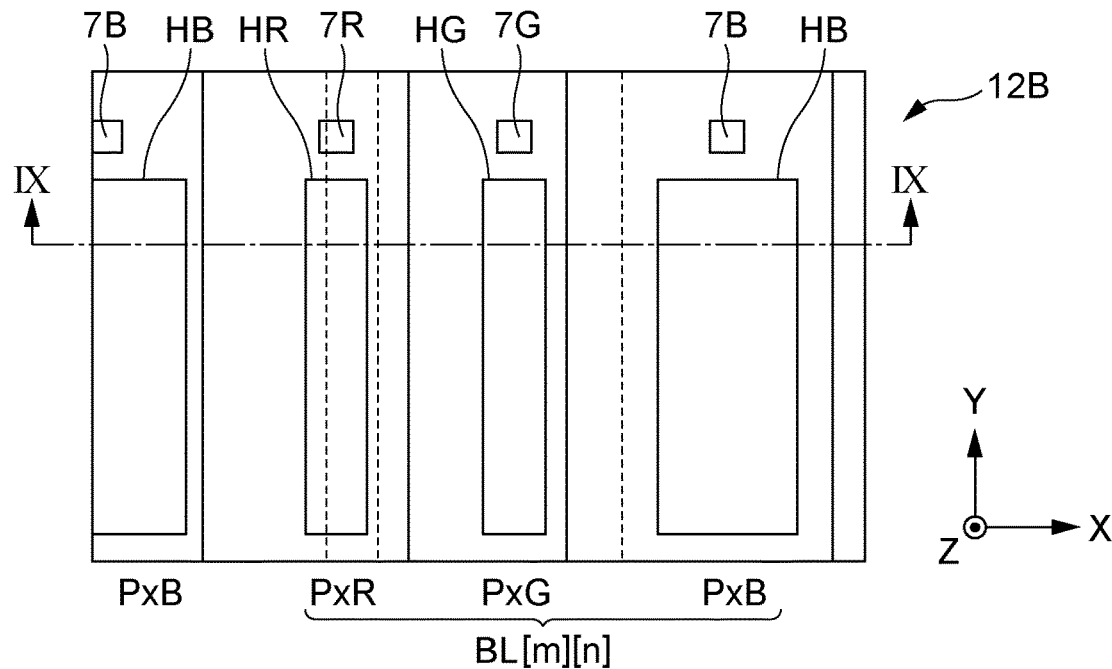
FIG. 8 is a plan view illustrating a configuration example of a display unit of an electro-optical device according to a second embodiment of the invention.
Figure 9:
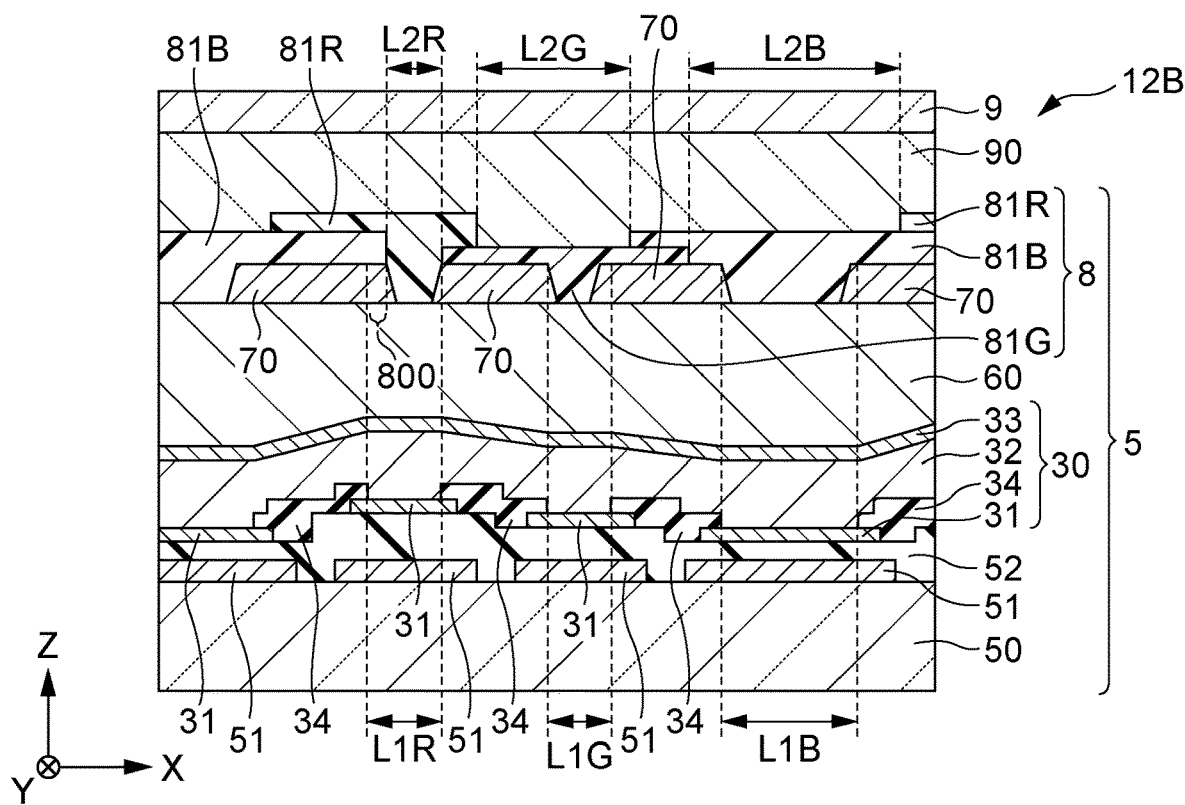
FIG. 9 is a partial sectional view illustrating a configuration example of the display unit of the electro-optical device according to the second embodiment of the invention.

FIG. 8 is a plan view illustrating a configuration example of the display unit 12B of the electro-optical device 1 according to the second embodiment of the invention. As is apparent from the comparison of FIG. 8 and FIG. 3, in the display unit 12B of the second embodiment, the point that the pixel PxB, the pixel PxR, and the pixel PxG are arranged so that each color stripe of B, R, and G extend along the Y direction is different from the display unit 12 of the first embodiment. FIG. 9 is a partial sectional view of the display unit 12B taken along with line IX-IX in FIG. 8. As is clear from the reference to FIG. 9, the color filter 81B has the projection portion 800 projecting toward the light emitting region HR of the pixel PxR and the projection portion 800 functions as a light shielding portion shielding the red light included in the white light emitted from the light emitting region HR in the display unit 12B. To have such light shielding portion, the width L2R of the opening portion of the pixel PxR becomes smaller than the width L1R of the light emitting region HR to exert the same effect as the first embodiment. For example, in a case where white display of 1,000 cd/m² and chromaticity (x, y)=(0.31, 0.31) is performed in the display unit 12B having the length of 7.5 μm from an end portion of the pixel PxB in the −X direction to the end portion of the pixel PxR in the +X direction in the pixel block BL, the same effect can be achieved as the first embodiment when each L1R, L2R, L1G, L2G, L1B, and L2B are set as shown in FIG. 10.

B-2. Third Embodiment

Figure 11:
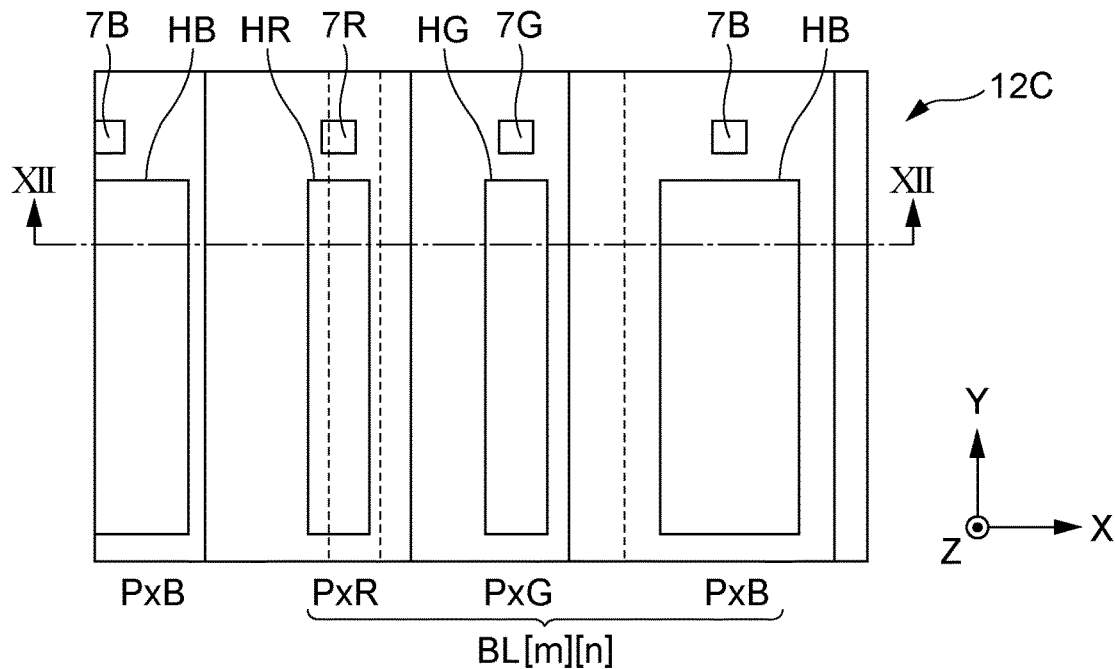
FIG. 11 is a plan view illustrating a configuration example of a display unit of an electro-optical device according to a third embodiment of the invention.
Figure 12:
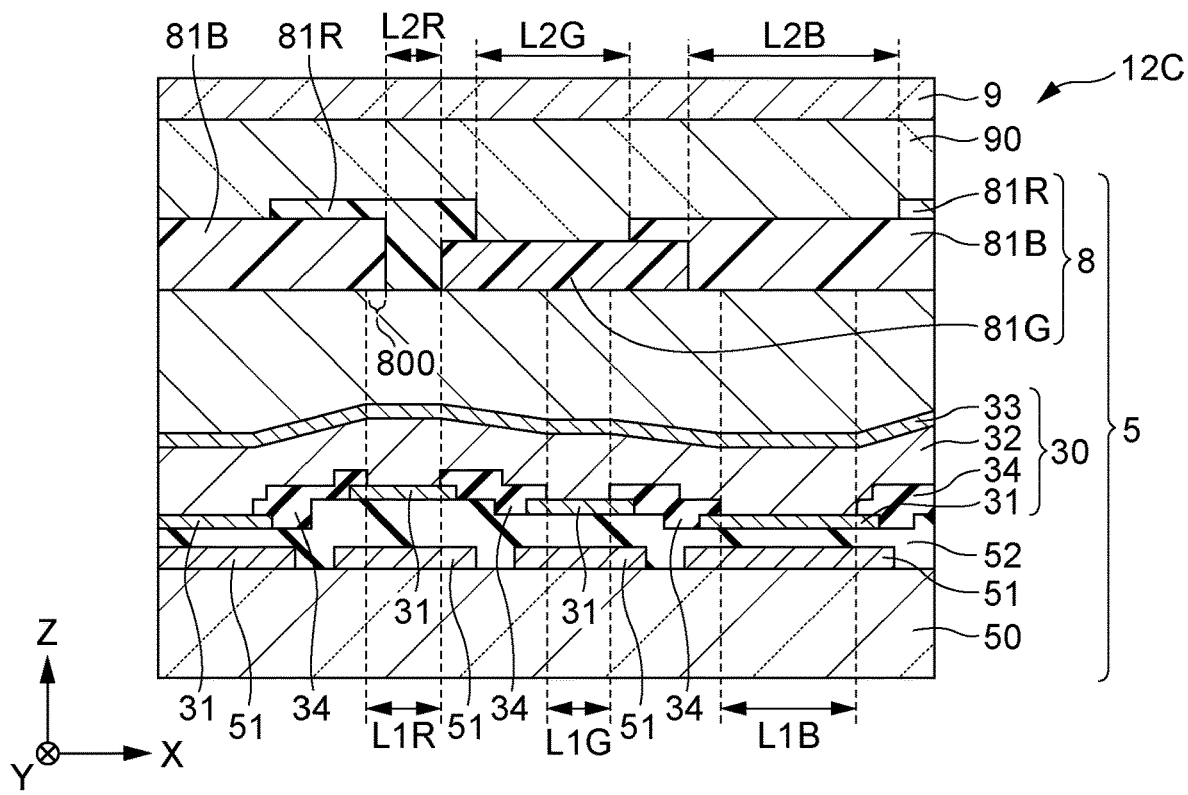
FIG. 12 is a partial sectional view illustrating a configuration example of the display unit of the electro-optical device according to the third embodiment of the invention.

FIG. 11 is a plan view illustrating a configuration example of a display unit 12C of the electro-optical device 1 according to the third embodiment of the invention. FIG. 12 is a partial sectional view of the display unit 12C taken along with line XII-XII in FIG. 11. The configuration of the display unit 12C is different from the display unit 12B from the point that the display unit 12C does not have the bank 70. As is clear with reference to FIG. 12, the color filter 81B has the projection portion 800 projecting toward the light emitting region HR of the pixel PxR and the projection portion 800 functions as a light shielding portion shielding the red light included in the white light emitted from the light emitting region HR in the display unit 12C. To have such a light shielding portion, the width L2R of the opening portion of the pixel PxR becomes smaller than the width L1R of the light emitting region HR, and exerts the same effect as the first embodiment.

B-3. Fourth Embodiment

Figure 13:
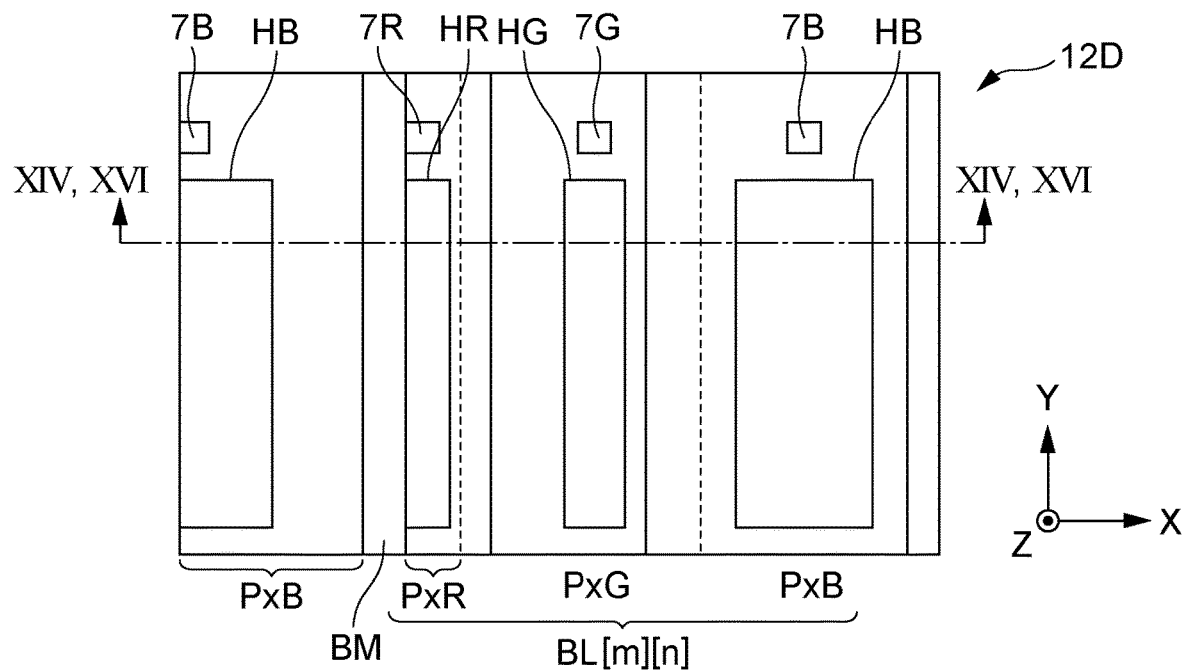
FIG. 13 is a plan view illustrating a configuration example of a display unit of an electro-optical device according to a fourth embodiment of the invention.
Figure 14:
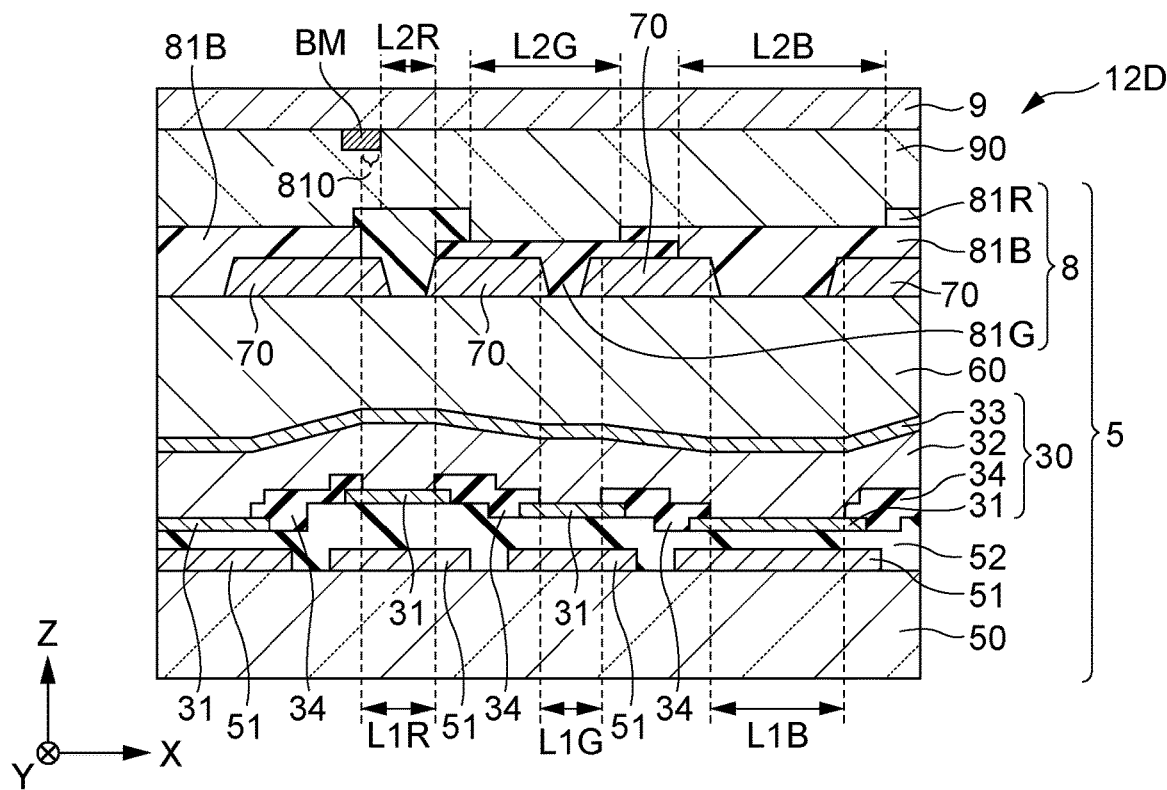
FIG. 14 is a partial sectional view illustrating a configuration example of the display unit of the electro-optical device according to the fourth embodiment of the invention.

FIG. 13 is a plan view illustrating a configuration example of a display unit 12D of the electro-optical device 1 according to the fourth embodiment of the invention. FIG. 14 is a partial sectional view of the display unit 12D taken along with line XIV, XVI-XIV, XVI in FIG. 13. The configuration of the display unit 12D is different from the configuration of the display unit 12C in the following two points. First, in the display unit 12D, the color filter 81B is not projected toward the light emitting region HR of the pixel PxR. Second, the display unit 12D has a black matrix BM between the pixel PxR and the pixel PxB. The black matrix BM may be configured of a metal such as chromium or titanium, or a resin not transmitting light. As illustrated in FIG. 14, in the black matrix BM, a projection portion 810 projecting toward the light emitting region HR is provided, and the projection portion 810 functions as a light shielding portion shielding the red light included in the white light emitted from the light emitting region HR. Accordingly, in the display unit 12D, since the black matrix BM provided between the pixel PxR and the pixel PxB functions as a light shielding portion shielding the red light included in the white light emitted from the light emitting region HR, the width L2R of the opening portion of the pixel PxR becomes smaller than the width L1R of the light emitting region HR, and exerts the same effect as the first embodiment.

B-4. Fifth Embodiment

Figure 15:
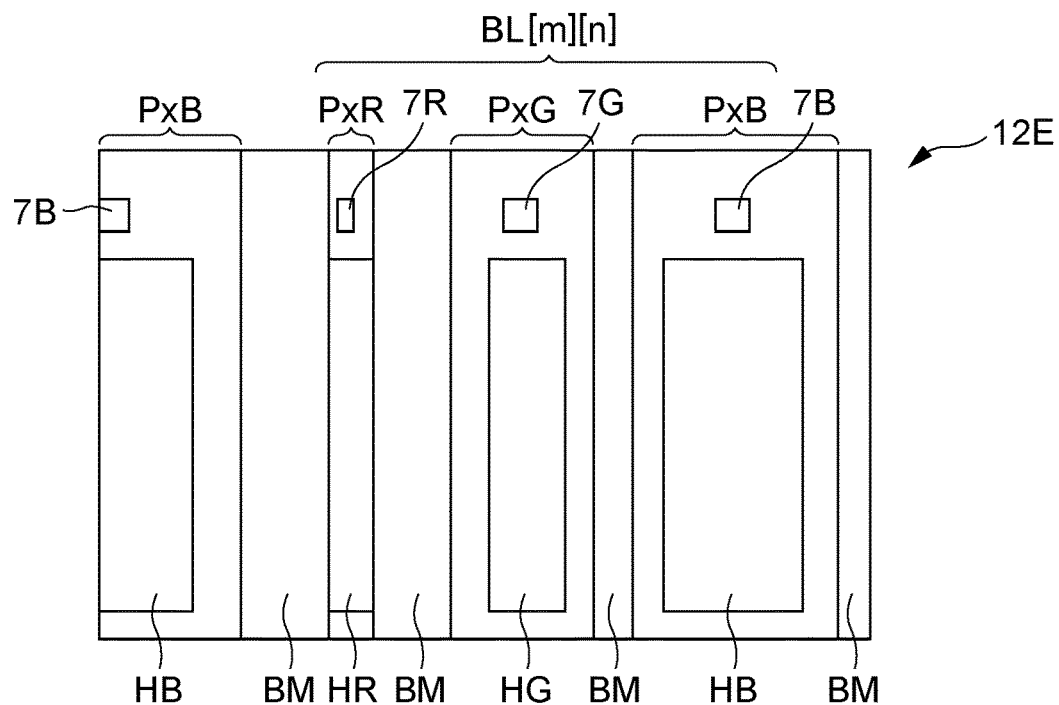
FIG. 15 is a plan view illustrating a configuration example of a display unit of an electro-optical device according to a fifth embodiment of the invention.
Figure 16:
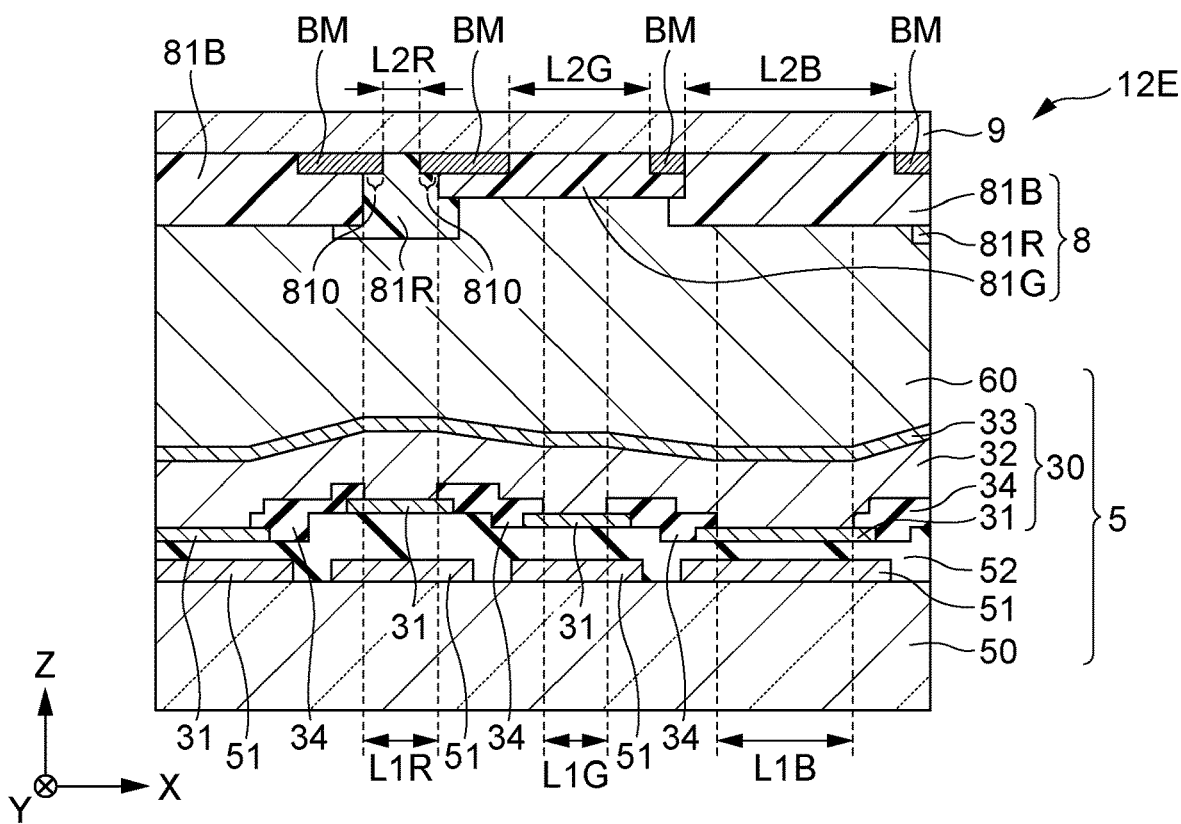
FIG. 16 is a partial sectional view illustrating a configuration example of the display unit of the electro-optical device according to the fifth embodiment of the invention.

FIG. 15 is a plan view illustrating a configuration example of a display unit 12E of the electro-optical device 1 according to the fifth embodiment of the invention. FIG. 16 is a partial sectional view of the display unit 12E taken along with line XIV, XVI-XIV, XVI in FIG. 13. The configuration of the display unit 12E is different from the configuration of the display unit 12D in the following two points. First, in the display unit 12D, the color filters 81R, 81B, and 81G are provided on the protection substrate 9 side, and does not have the adhesive layer 90. Second, the display unit 12D has a black matrix BM provided between the pixel PxR and the pixel PxG and a black matrix BM provided between the pixel PxG and the pixel PxB.

As illustrated in FIGS. 15 and 16, the black matrix BM provided between the pixel PxR and the pixel PxG, and the black matrix BM provided between the pixel PxR and the pixel PxB have a larger width than the black matrix BM provided between the pixel PxG and the pixel PxB, and all of the black matrixes BM have the projection portion 810 projecting toward the light emitting region HR. For this reason, the black matrix BM provided between the pixel PxR and the pixel PxG and the black matrix BM provided between the pixel PxR and the pixel PxB function as a light shielding portion for shielding the red light included in the white light emitted from the light emitting region HR. Thereby, the same effect in the first embodiment will be achieved in the fifth embodiment.

In the example illustrated in FIGS. 15 and 16, the black matrix BM provided between the pixel PxG and the pixel PxB is not projected toward the light emitting region HG, but may be provided with the projection portion 810 projecting toward the light emitting region HG may be provided on the black matrix BM, and may function as a light shielding portion for shielding the green light included in the white light emitted from the light emitting region HG. The point is, the electro-optical device may include a first pixel, a second pixel, a third pixel, a first light shielding portion provided between the first pixel and the second pixel, and a second light shielding portion provided between the second pixel and the third pixel, and the width of the first light shielding portion and the width of the second light shielding portion are different. The first pixel, for example, is the pixel PxR, the second pixel, for example, is the pixel PxB, and the third pixel, for example, is the pixel PxG. In addition, the first light shielding portion, for example, is a black matrix BM provided between the pixel PxR and the pixel PxB, or a projection portion projecting toward the light emitting region HG of the color filter 81B. The second light shielding portion, for example, is a black matrix BM provided between the pixel PxG and the pixel PxB, and is the black matrix BM having a projection portion projecting toward the light emitting region HG or a projection portion projecting toward the light emitting region HG of the color filter 81B. In the above-described electro-optical device, the width of the first light shielding portion may be larger than the width of the second light shielding portion in a case where a current value of a current flow in the light emitting element at the time of the white display is the lowest in the first pixel. The first to fourth embodiments correspond to a case where the width of the second light shielding portion is zero in the electro-optical apparatus.

As described above, it is obvious that the color filter 81R or the color filter 81B may function as a light shielding portion for shielding the green light included in the white light emitted from the light emitting region HG. However, each of the color filter 81R and the color filter 81B transmits a part of the green light. For this reason, considering the light shielding efficiency, it is preferable that the function of a light shielding portion for shielding the green light included in the white light emitted from the light emitting region HG be realized with the black matrix BM.

B-5. Sixth Embodiment

Figure 17:
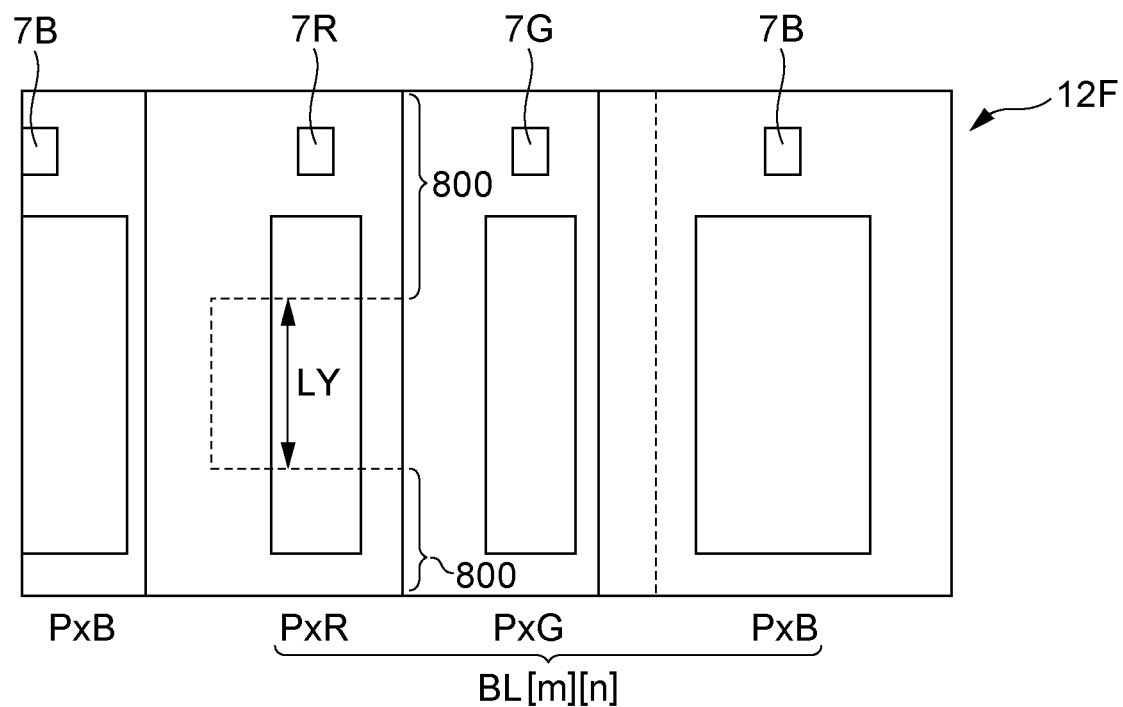
FIG. 17 is a plan view illustrating a configuration example of a display unit of an electro-optical device according to a sixth embodiment of the invention.

FIG. 17 is a plan view illustrating a configuration example of the display unit 12F of the electro-optical device 1 according to the sixth embodiment of the invention. In the display unit 12F according to the sixth embodiment, the color filter 81B includes the projection portion 800 projecting so as to cover the light emitting region HR excluding a section of a predetermined length LY in the Y direction in the light emitting region HR. For this reason, the area of the opening portion of the pixel PxR is smaller than the area of the light emitting region HR and, the same effect as in the first embodiment will be exerted.

C. Application Example

The electro-optical device 1 according to each above-described embodiment can be adapted to various types of the electronic apparatuses. Hereinafter, the electronic apparatus according to the invention will be explained.

Figure 18:
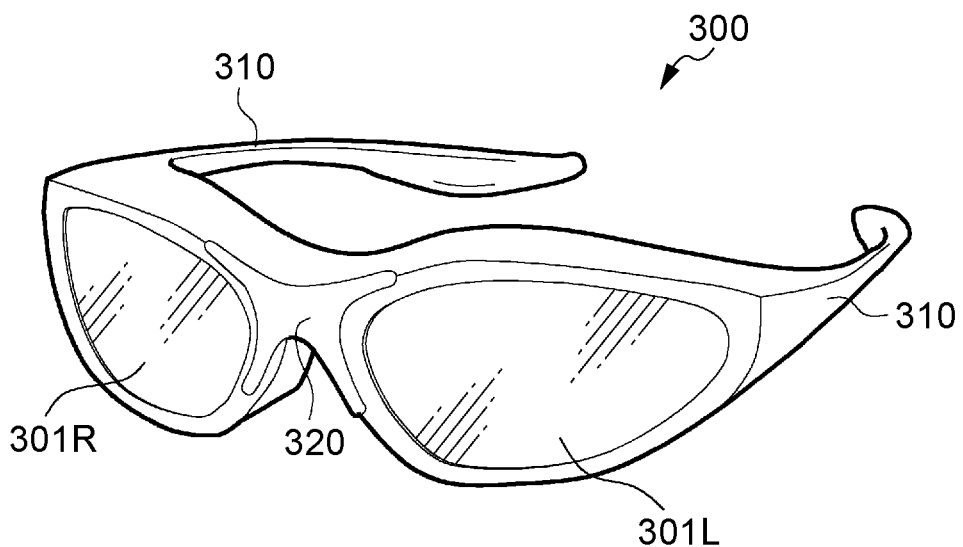
FIG. 18 is a perspective view of a head mounted display according to the invention.

FIG. 18 is a perspective view illustrating an appearance of a head mounted display 300 as the electronic apparatus adopting the electro-optical device 1 of the invention. As illustrated in FIG. 18, the head mounted display 300 includes a temple 310, a bridge 320, a projection optical system 301L, and a projection optical system 301R. In FIG. 18, the electro-optical device 1 (not illustrated) for the left eye is provided behind the projection optical system 301L, and the electro-optical device 1 (not illustrated) for the right eye is provided behind the projection optical system 301R.

Figure 19:
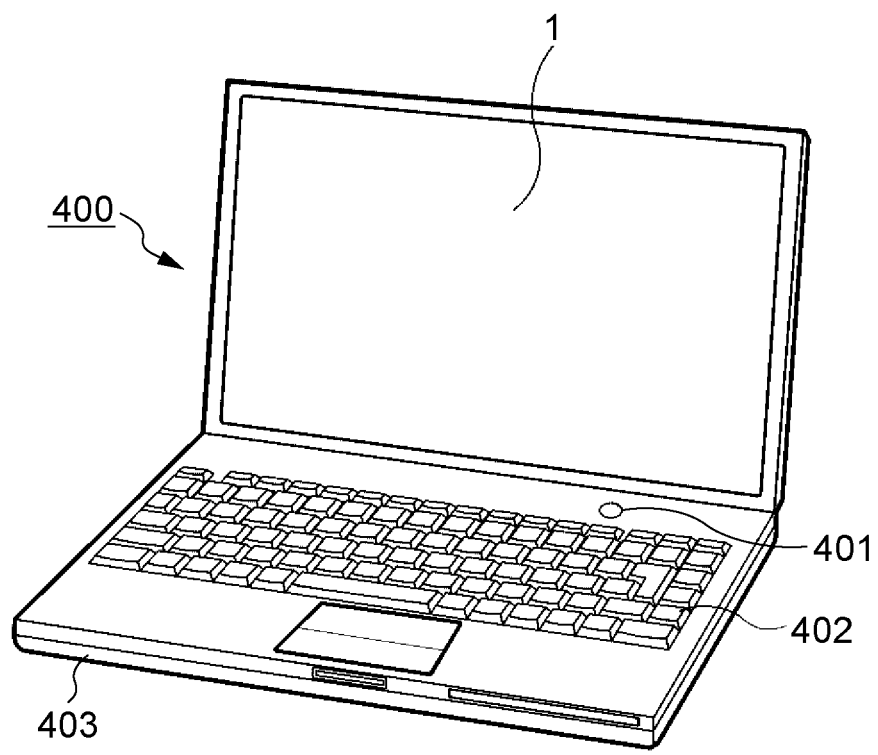
FIG. 19 is a perspective view of a personal computer according to the invention.

FIG. 19 is a perspective view of a portable personal computer 400 adopting the electro-optical device 1. The personal computer 400 includes the electro-optical device 1 displaying various types of images, and a main body portion 403 provided with a power supply switch 401 and a keyboard 402.

As an electronic apparatus to which the electro-optical device 1 according to the invention is applied, examples include a mobile phone, a smart phone, a personal digital assistants (PDA), a digital photographic camera, and a video camera in addition to the devices exemplified in FIGS. 18 and 19. Other examples of the electronic apparatus to which the electro-optical device 1 according to the invention is applied include a television, a car navigation device, an in-vehicle display device (instrument panel), an electronic notebook, an electronic paper, an electronic calculator, a word processor, a work station, a videophone, a POS terminal, and the like. Furthermore, the electro-optical device 1 according to the invention can be applied as a display unit provided in the electronic apparatus such as a printer, a scanner, a copying machine, and a video player.

The entire disclosure of Japanese Patent Application No. 2017-128236, filed Jun. 30, 2017 is expressly incorporated by reference herein.

What is claimed is:

1. An electro-optical device comprising:
a first pixel;
a second pixel;
a third pixel;
a first color filter covering a light emitting region of the first pixel;
a second color filter covering a light emitting region of the second pixel;
a third color filter covering a light emitting region of the third pixel, the second color filter having a projection portion that projects toward the light emitting region of the first pixel;
a first light shielding portion provided between the first pixel and the second pixel, the first light shielding portion being the projection portion; and
a second light shielding portion provided between the second pixel and the third pixel,
wherein the second light shielding portion does not project toward the light emitting region of the second pixel, and
wherein a width of the first light shielding portion and a width of the second light shielding portion are different.

2. The electro-optical device according to claim 1,
wherein each of the first pixel, the second pixel and the third pixel includes a light emitting element,
wherein a current value of a current supplied to the light emitting element of the first pixel is the lowest among the current values of the currents supplied to each light emitting element when displaying a white color, and
wherein the width of the first light shielding portion is larger than the width of second light shielding portion.

3. The electro-optical device according to claim 2,
wherein the first color filter transmits light having a longer wavelength compared to the second color filter and the third color filter.

4. The electro-optical device according to claim 3,
wherein the second color filter transmits light having a shorter wavelength compared to the third color filter.

5. The electro-optical device according to claim 4,
wherein the first pixel is interposed between the second pixels.

6. An electronic apparatus comprising:
the electro-optical device according to claim 5.

7. An electronic apparatus comprising:
the electro-optical device according to claim 4.

8. An electronic apparatus comprising:
the electro-optical device according to claim 3.

9. An electronic apparatus comprising:
the electro-optical device according to claim 2.

10. The electro-optical device according to claim 1,
wherein at least one of the first light shielding portion and the second light shielding portion is a black matrix.

11. An electronic apparatus comprising:
the electro-optical device according to claim 10.

12. An electronic apparatus comprising:
the electro-optical device according to claim 1.

13. An electro-optical device comprising:
a first pixel having a first light emitting region;
a second pixel having a second light emitting region;
a third pixel having a third light emitting region;
a first color filter covering the first light emitting region of the first pixel;
a second color filter covering the entire second light emitting region of the second pixel, the second color filter being different from the first color filter; and
a third color filter covering the third light emitting region of the third pixel, the third color filter being different from the first color filter and the second color filter,
wherein the second color filter has a projection portion projecting toward the first light emitting region of the first pixel, and the projection portion of the second color filter covers a part of the first light emitting region.

14. The electro-optical device according to claim 13,
wherein the first color filter transmits light having a longer wavelength compared to the second color filter and the third color filter.

15. An electronic apparatus comprising:
the electro-optical device according to claim 14.

16. An electronic apparatus comprising:
the electro-optical device according to claim 13.

* * * * *